US007289773B2

(12) United States Patent
Braithwaite (10) Patent No.: US 7,289,773 B2
(45) Date of Patent: Oct. 30, 2007

(54) DIGITAL TRANSMITTER SYSTEM EMPLOYING SELF-GENERATING PREDISTORTION PARAMETER LISTS AND ADAPTIVE CONTROLLER

(75) Inventor: Richard Neil Braithwaite, Orange, CA (US)

(73) Assignee: Powerwave Technologies, Inc., Santa Ana, CA (US)

( * ) Notice: Subject to any disclaimer, the term of this patent is extended or adjusted under 35 U.S.C. 154(b) by 54 days.

(21) Appl. No.: 10/889,636

(22) Filed: Jul. 12, 2004

(65) Prior Publication Data
US 2005/0009479 A1 Jan. 13, 2005

Related U.S. Application Data

(63) Continuation-in-part of application No. 10/761,788, filed on Jan. 21, 2004, now Pat. No. 6,985,706.

(60) Provisional application No. 60/442,099, filed on Jan. 23, 2003.

(51) Int. Cl.
*H04B 1/04* (2006.01)
(52) U.S. Cl. ............... 455/91; 455/114.3; 375/297
(58) Field of Classification Search ............ 455/114.2, 455/114.3, 412.1, 126, 514; 375/296, 297
See application file for complete search history.

(56) References Cited

U.S. PATENT DOCUMENTS

| | | | |
|---|---|---|---|
| 5,307,022 A | 4/1994 | Tattersall et al. ............. 330/52 |
| 5,489,875 A | 2/1996 | Cavers ........................ 330/151 |
| 5,644,268 A | 7/1997 | Hang ........................... 330/151 |
| 5,920,808 A * | 7/1999 | Jones et al. ............... 455/127.1 |
| 6,091,941 A * | 7/2000 | Moriyama et al. .......... 455/126 |
| 6,141,390 A * | 10/2000 | Cova ........................... 375/297 |
| 6,240,144 B1 * | 5/2001 | Ha .............................. 375/297 |
| 6,252,912 B1 * | 6/2001 | Salinger ..................... 375/278 |
| 6,377,119 B1 | 4/2002 | Hays ........................... 330/149 |
| 6,437,644 B1 * | 8/2002 | Kenington ................... 330/149 |
| 6,751,447 B1 * | 6/2004 | Jin et al. ................. 455/114.3 |
| 6,934,341 B2 * | 8/2005 | Sahlman ..................... 375/297 |
| 2002/0008577 A1 | 1/2002 | Cova et al. .................. 330/52 |
| 2003/0058959 A1 * | 3/2003 | Rafie et al. ................. 375/296 |

(Continued)

FOREIGN PATENT DOCUMENTS

EP 0 466 123 A1 1/1992

(Continued)

OTHER PUBLICATIONS

Supplementary Partial European Search Report for European Patent Application No. 04704477.1-2411.

(Continued)

*Primary Examiner*—Simon Nguyen
(74) *Attorney, Agent, or Firm*—Myers Dawes Andras & Sherman LLP (57) ABSTRACT

A method and apparatus for digital predistortion of power amplifiers are disclosed. Successful digital predistortion parameter settings are correlated with the operating conditions that affect the distortion of an amplifier. These operating conditions may include input power level, carrier frequency, temperature, DC supply voltage, or others. The successful predistortion parameter settings along with the corresponding operating conditions are stored in a list that is indexed using multi-dimensional attribute vectors. The elements of the list are generated automatically.

50 Claims, 7 Drawing Sheets

U.S. PATENT DOCUMENTS

2003/0072388 A1* 4/2003 Francos et al. ............. 375/298
2003/0104794 A1* 6/2003 Yang et al. ................. 455/118
2003/0179830 A1* 9/2003 Eidson et al. .............. 375/296

FOREIGN PATENT DOCUMENTS

| | | | |
|---|---|---|---|
| EP | 0 720 284 A1 | 7/1996 | |
| EP | 1 079 517 A2 | 2/2001 | |
| EP | 1 193 862 A2 | 4/2002 | |

OTHER PUBLICATIONS

K.J. Astrom, "Adaptive Feedback Control," *Proceedings of the IEEE*, vol. 75, No. 2, pp. 185-216, Feb. 1987.

* cited by examiner

DIGITAL TRANSMITTER SYSTEM EMPLOYING SELF-GENERATING PREDISTORTION PARAMETER LISTS AND ADAPTIVE CONTROLLER

RELATED APPLICATION INFORMATION

The present application is a continuation in part (CIP) of U.S. patent application Ser. No. 10/761,788 filed Jan. 21, 2004, now U.S. Pat. No. 6,985,706, which claims the benefit of provisional application Ser. No. 60/442,099 filed Jan. 23, 2003. The disclosures of both applications are incorporated herein by reference in their entirety.

BACKGROUND OF THE INVENTION

1. Field of the Invention

The present invention relates to digital transmitters, RF power amplifiers and amplification methods. More particularly, the present invention relates to digital transmitters, amplifiers and related methods that use adaptive techniques to linearize the gain transfer characteristics or reduce distortion emissions, such as digital predistortion.

2. Description of the Prior Art and Related Background Information

Wireless transmitters employed in RF communications systems employ RF power amplifiers as a key component and these are a major source of nonlinearity in the overall system. RF power amplifiers are devices that attempt to replicate an RF signal present at an input, producing an output signal with a much higher power level. The increase in power from the input to output is referred to as the 'gain' of the amplifier. When the gain is constant across the dynamic range of the input signal, the amplifier is said to be 'linear'. Amplifiers have limited capacity in terms of power delivered because of gain and phase variances, particularly saturation at high power, which makes all practical amplifiers nonlinear when the input power level varies. The ratio of the distortion power generated relative to the signal power delivered is a measure of the non-linearity of the amplifier.

In RF communication systems, the maximum allowable non-linearity of the amplifier is specified by government agencies such as the FCC or the ITU. Because amplifiers are inherently nonlinear when operating near saturation, the linearity requirements often become the limitation on rated power delivering capability. In general, when operating near saturation, the linearity of the amplifier degrades rapidly because the incremental signal power delivered by an amplifier is proportionally less than the incremental distortion power generated.

Various compensation approaches are conventionally applied to reduce the distortion at the output of the system, which in turn increases the rated power delivering capability. One approach is digital predistortion. In digital predistortion, the RF power amplifier is part of a RF transmitter where a digital input signal is converted to an analog signal (DAC), up-converted in frequency to create a RF signal, then amplified by the RF power amplifier. The predistortion is applied to the signal while it is in a digital format to compensate for nonlinearities later in the transmit path.

The most significant nonlinearity tends to be the gain of the RF power amplifier. Gain of the power amplifier relates the amplitude and phase of the RF output signal to the RF input signal. Nonlinear gain means that the amplitude and/or phase components of the gain vary as a function of the input signal amplitude. For the gain to be linear, the amplitude and phase components must be constant over the range of input signal amplitudes. Digital predistortion compensates for these gain fluctuations by predicting the RF gain fluctuation from the digital input signal and generating a digital gain that makes the overall gain of the transmitter, the series combination of the digital and RF gains, more linear than the RF gain alone. In order to accurately predict the RF gain variations from the digital input signal, a digital model of the inverse of RF gain is required. In general, the digital model—whether it is based a look-up-table, polynomial expansion, or both—has a parametric form where the inverse gain is the sum of basis waveforms derived from the input signal weighted by a vector of complex predistortion parameters. The predistortion parameters are adjusted using an adaptive controller for optimal distortion correction and gain linearization.

Most end users of power amplifiers have specifications limiting the time that the adaptive portion can take to achieve sufficient distortion correction. As a result, it is important to have good initial predistortion parameter settings when the adaptive controller begins its search for the best (or sufficient) predistortion parameters. Some such specifications have times as low as 10 seconds.

There have been numerous prior approaches to predistortion. In earlier approaches, the compensating gain was implemented using static analog circuitry, hand-tuned to be optimal for nominal operating conditions. Later digital approaches were introduced allowing greater flexibility in the inverse gain model. Look-up-tables and polynomial expansions dependent on the instantaneous input magnitude or power only were used to model memoryless distortion. As the bandwidths of the input signal increased, usually as a result of multi-carrier signal formatting, models were expanded to be functions of both the instantaneous and past input magnitudes, capturing a type of distortion referred to as "memory-based". Amplifiers exhibiting memory-based distortion are said to have "memory effects".

The nonlinear gain of the RF amplifier is not only a function of the instantaneous and recent past input magnitudes (referred to as the "envelope" of the input signal), it is also influenced by other input and environmental quantities such as the average input power, the number of carriers and their center frequencies within a multi-carrier format, temperature, and DC supply voltage (collectively referred to in this disclosure as "attributes"). These attributes are characterized as measurable quantities, largely independent of the power amplifier, that vary slowly or change infrequently relative to changes in the instantaneous magnitude (envelope) of the input signal. In prior art approaches, adaptive methods are applied to re-adjust the coefficients of the inverse gain model in response to changes in the RF gain due to changes in the input or environmental quantities. A means of measuring of output signal and converting it into a digital format is required. The digital input and digitized output signals are compared to estimate the residual distortion within the output signal from which the adjustments in the predistortion parameters are computed that reduce the output distortion. In such systems, the convergence time is dependent on the size and abruptness of the change in the attribute quantities and the sensitivity of the power amplifier gain to the attributes. During the transient (converging predistortion parameter) periods, the distortion at the output might exceed the spectral mask specifications, which is not desirable.

To avoid transient distortion, the prior art has relied on look-up tables (LUT's) that are indexed using one or more of the attribute quantities. For the case where the inverse gain model is represented using a polynomial expansion, the entries of the LUT are coefficients of the expansion considered optimal for the corresponding attribute (index) quantity. For the case where the inverse gain model is also represented by LUT structure indexed to the instantaneous amplitude (envelope) of the input signal, a multi-dimensional table is formed. However, in the context of this invention, the dimensions indexed by the attribute, and not those of the envelope of the input signal, are of interest.

As indicated above, look-up tables in the past have used a fixed structure. The input, such as temperature, is an index to an array. The indices are equally spaced across the range in ascending order, and the corresponding predistortion parameters are stored within the array. The array of vectors forms a two-dimensional LUT. This structure is well suited to memory chips because the index is equivalent to an address and the predistortion parameters are equivalent to the data. However, the look-up tables are usually based on experimental data (calibration) requiring significant time to fill-in the elements of the table. In addition, drift from component aging can make any look-up table obsolete, necessitating a re-calibration.

Another difficulty with look-up tables is that it can be extremely difficult to manage multi-dimensional arrays, which would be required if many operating conditions are present which affect the optimal predistortion parameters. One can imagine the number of elements present in an equally spaced four-dimensional array. For example, 10 samples per dimension produces 10000 elements.

One technique of managing multiple indexing dimensions is to assume that the effects are separable. Separable conditions would allow the use of individual arrays for each operating condition, and the composite effect would be the sum of the individual adjustments. (Not unlike a Taylor series expansion where the partial derivatives are specified). Unfortunately, this approach is valid only for small (differential) alignment adjustments because any cross-correlation between dimensions is ignored. The largest error would occur at the corners of the multi-dimensional array. For example, a troublesome corner in the temperature, DC supply index space would be high temperature and low voltage. It is these corner locations that are tested, typically, by sophisticated customers for determining if the amplifier is compliant with specifications.

A related problem with the array-based look-up table is the selection of the sampling interval (separation between adjacent indices) within the index space. In general, the sensitivities of the predistortion parameter settings vary over the index space. The sampling density must be selected based on the most sensitive region of the index space. The remaining regions will be over-sampled. This problem of over-sampling is made more significant for multi-dimensional arrays.

There have been attempts to make look-up tables self-calibrating or self-generating. However, the fixed array structure is difficult to manage. The key problem encountered is 'update fragmentation'. Consider the previously-mentioned four-dimensional array case. When the look-up table is updated, only one element of 10000 is changed. If the source of the degradation is global (due to component drift, for example), then all 10000 elements are affected. However, the changes must propagate as each index is visited. The potential for neighboring indices to have large differences exists, simply because one of the indices is older.

Accordingly, a need presently exists for a system and method for rapid predistortion parameter control in a digital predistortion amplifier system which avoids the above noted limitations of the prior art.

SUMMARY OF THE INVENTION

In a first aspect the present invention provides a digital RF transmitter system comprising an input for receiving a digital input signal, a transmission path and an observation path. The transmission path comprises a digital predistorter employing adjustable predistortion parameters to predistort the digital input signal, a digital-to-analog converter, an RF up converter, an RF power amplifier, and an output sampling coupler receiving the amplified RF output signal. The observation path, which measures the sampled output of the coupler, comprises an RF down converter and an analog-to-digital converter providing the sampled RF output signal in a digital format. The digital RF transmitter system further comprises an adaptive controller coupled to receive the digital input signal and the sampled digital output signal to determine the residual distortion within the output signal and coupled to receive one or more parameters characterizing the operating condition of the amplifier. The adaptive controller is coupled to the digital predistorter and provides adjusted predistortion parameters to the digital predistorter to reduce the distortion further and comprises a predistortion parameter list having a plurality of list elements, each element having one or more predistortion parameters and one or more parameters characterizing the operating condition of the amplifier system.

In a preferred embodiment of the digital RF transmitter system the adjustable predistortion parameters are part of an inverse gain model which alters the gain of the transmitter path as a function of nonlinear modes of the input magnitude. The adjustable predistortion parameters may comprise weights for both memoryless and memory-based basis waveforms. The parameters characterizing the operating condition of the amplifier may comprise one or more of temperature, DC power supply, input signal power and input signal carrier frequency. Preferably, the parameters characterizing an operating condition of the amplifier comprise an attribute vector and a distance is defined between any two attribute vectors. The adaptive controller derives a current attribute vector from input parameters and computes the distance to the attribute vectors of the list elements and selects the list element with the least distance for use as predistortion parameters in the digital predistorter. The adaptive controller may continually measure distortion using the digital output and digital input and a set of predistortion parameters are retrieved from the predistortion parameter list when the measured distortion exceeds a predetermined value. The adaptive controller may also continually measure the attribute vector and a set of predistortion parameters are retrieved from the predistortion parameter list when the change of the measured attribute vector is in excess of a predetermined value. The adaptive controller may employ a selected element as an initial set of predistortion parameters and compute new predistortion parameters from the initial set of parameters employing an iterative control algorithm. The adaptive controller then updates the predistortion parameter list with new predistortion parameters after completing the iterative computation. The distance between closest attribute vectors may vary throughout the predistortion parameter list.

According to another aspect the present invention provides an adaptive controller for controlling the distortion compensation of an amplifier system. The adaptive controller comprises one or more inputs for receiving one or more attribute parameters corresponding to current operating conditions of the amplifier system. The adaptive controller further comprises one or more processors coupled to the one or more inputs, the one or more processors having an associated list of predistortion parameter settings and programmed with a predistortion parameter list algorithm and a controller algorithm to provide adjustments to the predistortion parameter settings to control the distortion correction of the amplifier system. The predistortion parameter list algorithm generates the predistortion parameter list with predistortion parameter settings computed by the controller algorithm and associates one or more attribute parameters with each predistortion parameter setting. In a preferred embodiment of the adaptive controller the predistortion parameter list algorithm selects a predistortion parameter setting from the predistortion parameter list for use by the controller algorithm at start up or when the output distortion becomes sufficiently large. The predistortion parameter list algorithm preferably selects a stored predistortion parameter setting for use by the controller algorithm by computing the distance between the one or more attribute parameters corresponding to current operating conditions and the attribute parameters associated with each of the predistortion parameter settings in the list and selecting the predistortion parameter setting corresponding to the attribute parameter with the minimum distance. The distance computation may be weighted with different weights for different attribute parameters. The attribute parameters may comprise one or more of temperature, DC supply voltage, input signal power and input signal carrier frequency. The distance $d_{attr}$ between two sets of attribute parameters "n" and "0" may be defined by the weighted $L_{inf}$ norm distance measure or the weighted $L_2$ norm distance measure. The adaptive controller preferably further comprises one or more inputs for receiving output distortion data. The output distortion data comprises a baseband digital representation of the output signal provided from an observation path. The predistortion parameter settings may be coefficients in a polynomial expansion including bandlimited nonlinear modes modeling memory effects in the amplifier system.

According to another aspect the present invention provides a method for controlling an amplifier system having an adaptive control loop comprising a control loop input, a first signal path including a digital predistorter and an RF amplifier, and a second signal path which feeds back the output of the RF amplifier. The method comprises providing a list of predistortion parameter settings, each predistortion parameter setting having an associated operating condition. The method further comprises detecting the current operating conditions of the amplifier system, comparing the current operating conditions to those in the list of predistortion parameter settings and selecting the predistortion parameter setting associated with the most similar operating condition in the list.

In a preferred embodiment of the method for controlling an amplifier system the relevant operating conditions are configured as a multi-dimensional attribute vector. Comparing the current operating conditions to those in the list of predistortion parameter settings preferably comprises measuring a distance between the current attribute vector and each of the attribute vectors of the list. Selecting the predistortion parameter setting associated with the most similar operating condition in the list then comprises determining the attribute vector having the minimum distance from the current operating condition attribute vector. The method may also further comprise computing a new predistortion parameter setting employing an iterative adaptive controller algorithm, wherein the predistortion parameter setting associated with the most similar operating condition is used as the initial predistortion parameter setting for the adaptive controller algorithm. The method may also further comprise updating the predistortion parameter list with a new predistortion parameter setting computed by the adaptive controller algorithm. The size of the predistortion parameter list may be dynamic. Also, the spacing of the stored predistortion parameter settings, as defined by the attribute vector distance, may vary throughout the list. For example, a higher density of predistortion parameter settings may be provided in regions of the list where the distortion correction is most sensitive to one or more operating conditions comprising the attribute vector.

According to another aspect the present invention provides a method of maintaining a list of predistortion parameter settings of an adaptive digital predistortion amplifier system, the list comprising a plurality of elements each element having a predistortion parameter setting and a set of operating condition parameters corresponding to operating conditions of the amplifier system. The method comprises selecting an element of the predistortion parameter list and determining the element of the predistortion parameter list having the most similar corresponding operating conditions to the selected element. The method further comprises determining if the two elements are sufficiently similar to be considered redundant and deleting the oldest of the two elements of the predistortion parameter list if the elements are redundant.

In a preferred embodiment of the method of maintaining a list of predistortion parameter settings of an adaptive digital predistortion amplifier system, selecting an element of the predistortion parameter list comprises selecting the oldest element of the list not previously subject to list maintenance processing. Determining the element of the predistortion parameter list having the most similar corresponding operating conditions to the selected element preferably comprises determining a distance measure to the operating condition parameter values of each of the remaining elements of the predistortion parameter list and selecting the element having the minimum distance. The distance measure may comprise a weighted difference between operating condition parameter values. The operating condition parameters of the amplifier system may comprise one or more of temperature, DC power supply, input signal power and input signal carrier frequency. Determining if the elements are sufficiently similar to be considered redundant preferably comprises determining a distance measure between the predistortion parameter settings and comparing the predistortion parameter distance to a redundant distance threshold. Alternatively, determining if the elements are sufficiently similar to be considered redundant may comprise comparing the distance between the operating condition parameters of the two elements to an outdated distance threshold. The method may also further comprise repeating the list maintenance processing for each element of the predistortion parameter list.

According to another aspect the present invention provides a method of generating a hierarchical list of predistortion parameter settings of an adaptive digital predistortion amplifier system. The list comprises a plurality of elements each element having a predistortion parameter setting and a corresponding set of parameters corresponding to operating conditions of the amplifier system, and has a hierarchical structure comprising at least two levels. The method comprises selecting an element in a first level of the predistortion parameter list. The method further comprises determining the element of the first level of the predistortion parameter list having the most similar corresponding operating conditions to the selected element and demoting the oldest of the two elements to a lower level of the hierarchical predistortion parameter list.

In a preferred embodiment of the method of generating a hierarchical list of predistortion parameter settings of an adaptive digital predistortion amplifier system, determining the element of the predistortion parameter list having the most similar corresponding operating conditions to the selected element comprises determining a distance measure to the operating conditions of each of the remaining elements of the first level of the predistortion parameter list and selecting the element having the minimum distance. The method may further comprise determining if the two elements are redundant, wherein the older element is only demoted if the elements are redundant. The method may further comprise repeating the list processing for each level of the hierarchical list. The method may also comprise deleting the older entry if the list maintenance processing is at the lowest level of the hierarchy. The demoted element is preferably associated as a subset list entry of the redundant element not demoted. An element being demoted and having a subset list is preferably merged with the subset list of a redundant element not demoted.

According to another aspect the present invention provides a method for controlling an amplifier system having an adaptive control loop comprising a control loop input, a first signal path, a second signal path, and a control loop output, at least one of the first and second signal paths including an amplifier and a predistorter. The method comprises providing a hierarchical list of predistortion parameter settings having at least two levels, each predistortion parameter setting having an associated operating condition and some or all of the predistortion parameter settings in a highest level having subset predistortion parameter settings in a lower level. The method further comprises detecting the current operating conditions of the amplifier system and comparing the current operating conditions to those in the highest level of the hierarchical list of predistortion parameter settings. The method further comprises selecting the predistortion parameter setting associated with the most similar operating condition in the highest level of the list. The method further comprises comparing the current operating conditions to those in the subset of the selected highest level predistortion parameter setting. The method further comprises selecting the predistortion parameter setting of the subset with the most similar operating condition. The method further comprises selecting the predistortion parameter setting in the higher or lower level having the most similar operating condition to the current operating condition.

In a preferred embodiment the method for controlling an amplifier system comprises repeating the processing for each level of the hierarchical list until the next lower subset is empty. The highest level may have a coarser spacing of predistortion parameter settings than the lower level. For example, any two predistortion parameter settings may have a predistortion parameter distance and the highest level has a larger predistortion parameter distance between settings than the lower level. The predistortion parameter distance may comprise a weighted difference between the predistortion parameter settings. For example, the predistortion parameter settings may comprise an inverse gain model settings and the weighting may comprise predistortion parameter sensitivity.

Further features and advantages of the present invention are set out in the following detailed description.

DETAILED DESCRIPTION

Figure 1:
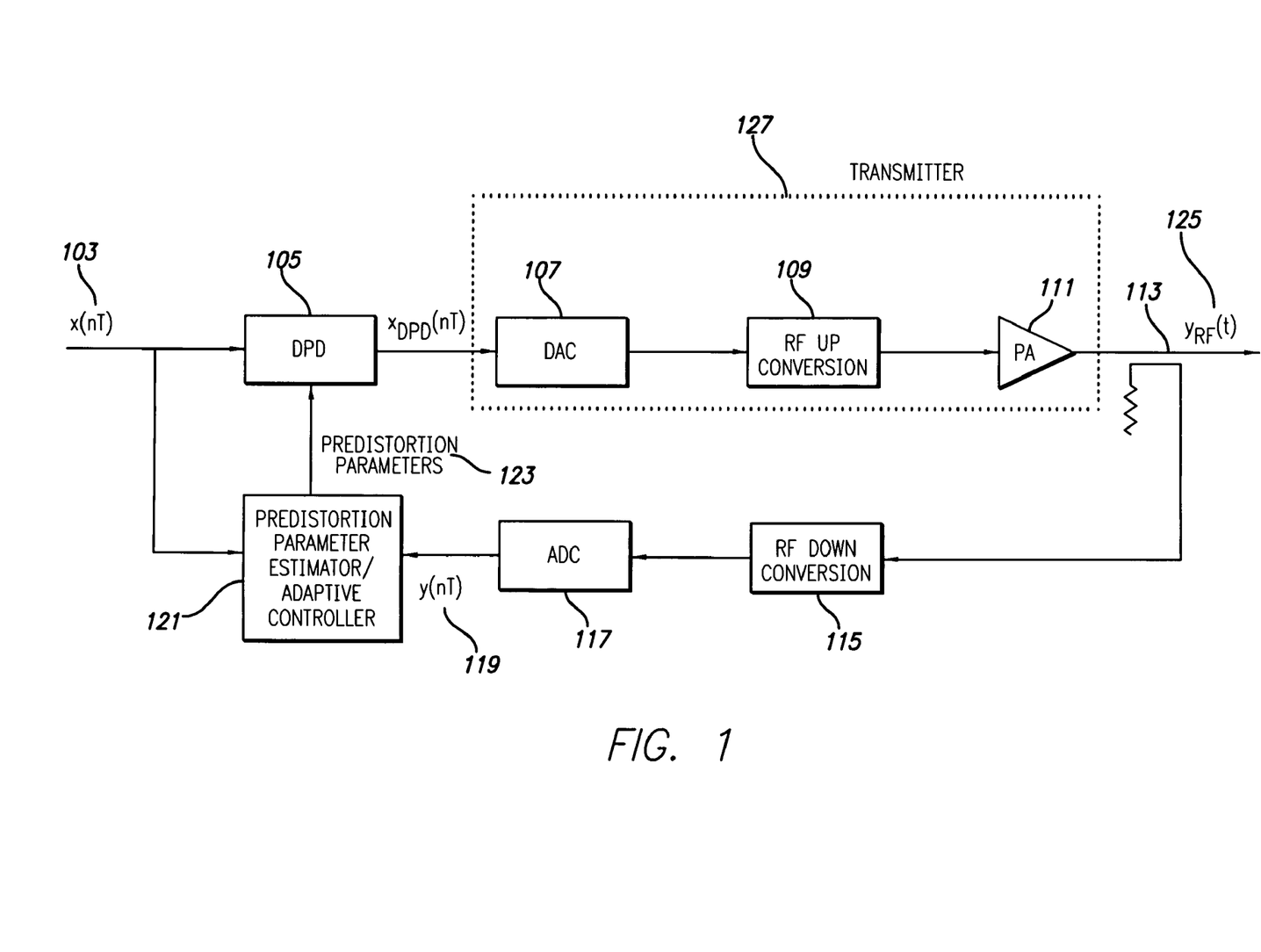
FIG. 1 is a block schematic drawing of a digital transmitter system including a RF power amplifier and a digital predistortion module in accordance with the present invention.
Figure 2:
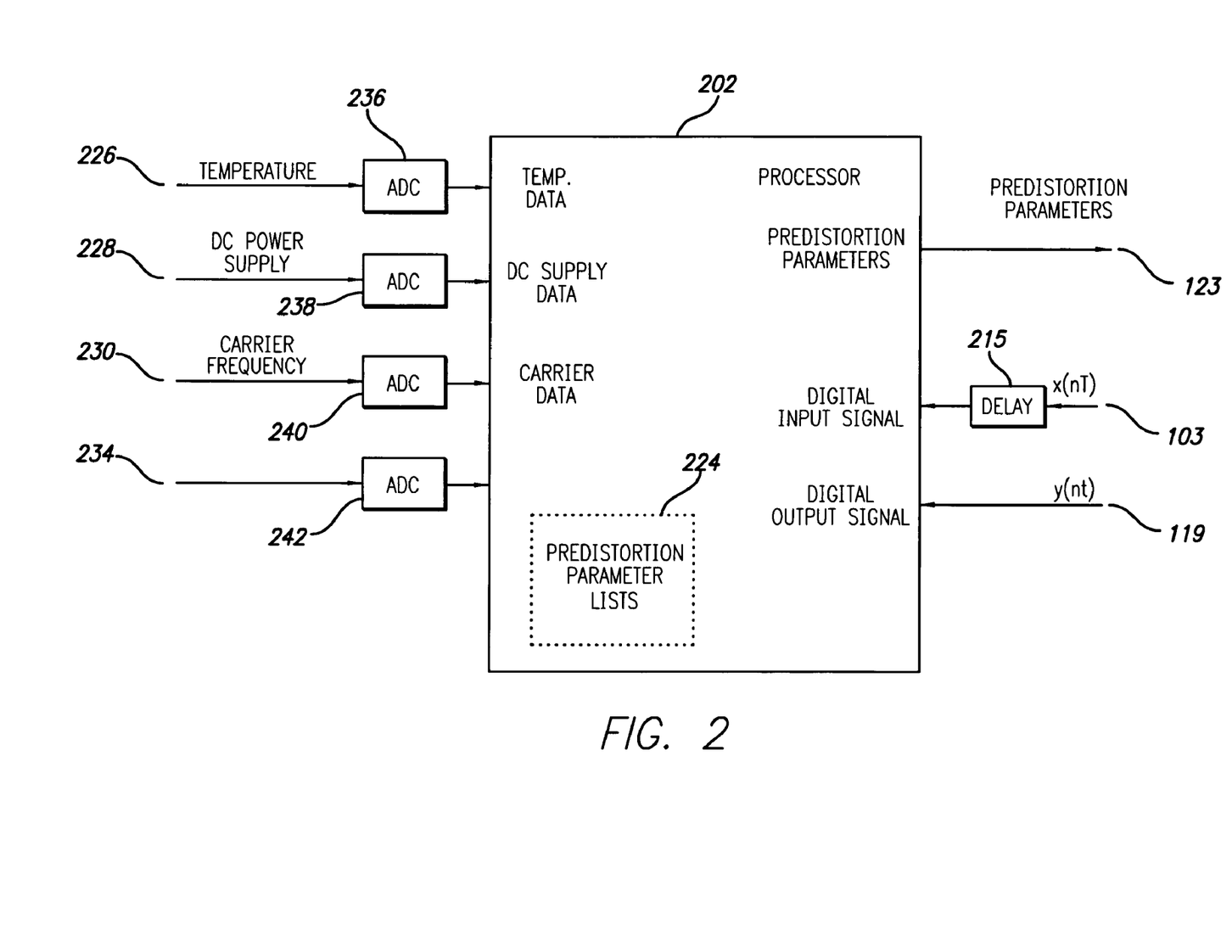
FIG. 2 is a block schematic drawing of a control system of a digital transmitter system in accordance with the present invention.

A block diagram of the RF transmitter system employing a power amplifier (PA) that is linearized using digital predistortion in accordance with a preferred embodiment of the present invention is shown in FIGS. 1 and 2. FIG. 1 illustrates the basic digital predistortion transmitter and FIG. 2 illustrates the control system.

As shown in FIG. 1, the digital predistortion linearized transmitter has a conventional architecture employing a transmit path and an observation (or feedback) path. The transmit path comprises a digital signal input 103, digital predistortion (DPD) module 105, digital to analog conversion (DAC) device 107, RF up conversion device 109, RF power amplifier 111, output coupler 113, and RF output signal 125. The observation path comprises the output coupler 113, RF down conversion device 115, analog-to-digital conversion (ADC) device 117, and a digital version of the sampled output signal 119. The digital input signal 103 and the digital output signal 119 are inputs to the predistortion parameter estimator/adaptive controller module 121 (referred to as the "adaptive controller" for short). The output of the adaptive controller 121 is a set of predistortion parameters 123 used by the digital predistortion module 105 to linearize the transmitter 127, which comprises digital to analog conversion device 107, RF up conversion device 109 and the RF power amplifier 111.

The adaptive controller 121 is shown in FIG. 2. As shown in FIG. 2, the adaptive controller may comprise a processor 202 which implements both adaptive controller and predistortion parameter list algorithms described in detail below. The predistortion parameter lists are stored in a suitable memory 224 and are organized and accessed in a manner described in detail below. Alternatively, separate processors may be provided for the adaptive controller and predistortion parameter list functions. The predistortion parameters 123 are used by the digital predistortion module 105 to implement the digital predistortion. More specifically, the adjustable predistortion parameters are preferably part of an inverse gain model which alters the gain of the transmitter path as a function of nonlinear modes of the input magnitude. The adjustable predistortion parameters may also comprise weights for both memoryless and memory-based basis waveforms. For example, the predistortion parameters may be coefficients in a polynomial expansion including band-limited nonlinear modes modeling memory effects in the amplifier system. Such an implementation may employ the teachings of provisional patent application Ser. No. 60/485,246 filed Jul. 3, 2003, the disclosure of which is incorporated herein by reference in its entirety. Alternatively, a variety of different digital predistortion approaches may be employed and associated predistortion parameters provided employing techniques known to those skilled in the art.

The processor receives the input data 103 through a delay 215 and also receives the output data 119. The delay 215 is chosen such that the input data 103 and output data 119 are time-aligned at the processor. The time alignment delay 215 may be implemented as part of the processor. The processor also receives inputs corresponding to current operating conditions of the amplifier system. For example, inputs for temperature, DC power supply, and input RF signal carrier frequency 226, 228, 230 may be provided which are converted to digital form by analog to digital converters 236, 238, 240. Other operating condition inputs 234 may be provided and converted to digital form by A/D converters 242.

First the general principles of operation of the digital predistortion transmitter system will be described. The adaptive digital predistortion control system provides rapid convergence properties by remembering and reusing successful predistortion parameter settings. The system has the ability to learn the effect that operating conditions such as temperature, DC supply, input power level, and carrier frequency have on the optimal (steady-state) predistortion parameters. As a result, the predistortion control system can respond to changes in these operating conditions faster than an adaptive controller acting alone.

More specifically, the adaptive controller function of the processor is to measure the residual distortion within the output signal and adjust the predistortion parameters of the predistortion module. The controller adjusts the predistortion parameters in an iterative fashion, searching for the minimum residual distortion. During the transient period when the search is not complete, the predistortion parameter error (difference between the current and steady-state predistortion parameters) degrades the performance of the predistortion power amplifier and degrades the linearity of the system. To minimize the transient degradation, good initial predistortion parameters are desired. In addition, the potential for instability due to a diverging adaptive controller is reduced by good initial predistortion parameters.

To achieve a set of good initial predistortion parameters, the predistortion power amplifier control system processor 202 maintains a list 224 of previous successful predistortion parameter settings. Before requesting the use of the adaptive controller, the processor 202 searches the predistortion parameter list for a past predistortion parameter settings used under similar operating conditions. The operating conditions are represented as a multi-dimensional attribute vector. The attribute 'distance', defined below, is computed by comparing the present attributes with the stored values. In some cases, the initial predistortion parameters from the list will provide sufficient correction of distortion thereby avoiding the use of the adaptive controller.

The attribute distance is also used to predict changes in the state of the predistortion power amplifier system. When abrupt changes in the current attribute vector are detected, the predistortion power amplifier system adjusts its task scheduling. (Note that the term 'current' is used throughout this document to describe 'present time' and should not be interpreted as 'electron flow'). Maintenance tasks are exited in favor of predistortion parameter estimation.

The distortion correction involves the control of predistortion parameter settings of the digital predistortion module to minimize the distortion power detected at the output signal within FIG. 1. The adaptive control function may employ conventional digital predistortion techniques found in the prior art.

There are many operating conditions that affect the optimal predistortion parameter settings. These include environmental conditions, application specific conditions and system specific conditions. For example, temperature, input power level x(t), carrier frequency, and DC supply voltage will be relevant operating conditions for most applications and these are provided as inputs 226, 234, 230 and 228 as shown in FIG. 2. Time may also be considered as a parameter affecting the predistortion parameters because of component aging. All of these parameters are measurable within the digital predistortion transmitter system and may be monitored by processor 202. In the control system of the present invention, the relevant measurable parameters are used to form an attribute vector. Attribute vectors and the associated predistortion parameter settings when the controller has converged to a steady-state are stored in the predistortion parameter list in memory 224. Correlation of the attribute vector to the predistortion parameter setting is achieved by the predistortion parameter list. The disclosed system combines the predistortion parameter list processing with the adaptive controller processing to allow rapid convergence to the steady-state predistortion parameters.

Next, referring to FIGS. 1-8 a detailed embodiment of the present invention will be described.

First, a preferred embodiment of the manner in which the attribute vector and predistortion parameter settings are represented and stored within the predistortion parameter list is described. A distance metric for measuring the similarity of attribute vectors is also described. A process for pruning the predistortion parameter list is also discussed to allow maintenance of a manageable number of list entries while maintaining coverage of the attribute space. Next the use of the predistortion parameter list and the adaptive controller to adjust the predistortion parameters is described. Also the self-generation of elements within the predistortion parameter list is described. An alternative predistortion parameter list structure based on a hierarchical list structure is then described in relation to FIGS. 6-8.

As described above sets of attribute parameters, or attribute vectors, are employed to allow the digital predistortion transmitter system to learn from the past actions. By correlating attribute vectors with past predistortion parameter settings, the convergence of the predistortion parameter estimate becomes faster and more robust. The attribute parameters that affect the digital predistortion transmitter system for a given application are determined in defining the attribute vector. Temperature, average input power, and center frequency are typically important parameters for cellular applications because they are both time-varying and affect the gain. Other parameters such as the modulation format and number of carriers also affect the gain; however, if these parameters are constant over time, they provide little value as part of the attribute vector and may be excluded from the attribute vector.

To determine the similarity of two attribute vectors, a distance measure is employed. The difference (squared or absolute difference) between each parameter is weighted based on its sensitivity with respect to the digital predistortion transmitter system gain. That is, parameters with a larger effect on the digital predistortion transmitter system gain are weighted more heavily. These sensitivities may be estimated using part specifications or experiments for the particular implementation and application requirements.

Specifically, let the attribute vector for the predistortion parameter list element 'n' be defined as $$\bar{p}(n)=[p_0(n) \ldots p_m(n)] \quad \text{(Eq. 1)}$$

where $p_k$ is the value of the attribute parameter 'k' (such as temperature). To ease the implementation of the distance measure on the processor 202, a weighted $L_{inf}$ norm may be used: that is, the distance between elements 'n' and '0', denoted by $d_{attr}(n,0)$, is defined as:

$$d_{attr}(n,0)=\max_k\{w_k o|p_k(n)-p_k(0)|\} \quad \text{(Eq. 2)}$$

where $w_k$ is the weight for parameter 'k'. Alternative distance measures such as the $L_2$ norm may also be employed. The weighted $L_2$ norm measure of the distance between elements 'n' and '0', denoted by $d_{attr}(n,0)$, is defined as:

$$d_{attr}(n, 0) = \left[\sum_k \{w_k \circ | p_k(n) - p_k(0)|^2\}\right]^{0.5} \quad \text{(Eq. 3)}$$

It is also of value to measure the similarity of the predistortion parameter settings by defining a distance $d_{DPD}$ between two predistortion parameter settings. Once again, the $L_{inf}$ norm may be used:

$$d_{DPD}(n,0)=\max_k\{s_k o|\Delta_k(n,0)|\} \quad \text{(Eq. 4)}$$

where $\Delta_k(n,0)$ the difference of the 'k' predistortion parameter between the 'n' list element and the '0' list element, and $s_k$ is the respective sensitivity. Once again, alternative distance measures such as the $L_2$ norm may also be employed. The $L_2$ norm measure of $d_{DPD}$ is:

$$d_{DPD}(n, 0) = \left[\sum_k \{s_k \circ | \Delta_k(n, 0)|^2\}\right]^{0.5} \quad \text{(Eq. 5)}$$

The predistortion parameter list structure may be dynamic in nature. Both the list entries and the number of entries may change dynamically. More specifically, along with the attribute vector, the processor 202 tracks the past successful predistortion parameter settings. Before implementing the adaptive controller function, processor 202 tests the residual distortion associated with the current predistortion parameter setting. If it is adequate in terms of distortion correction quality, no action is required. If it is not adequate, the predistortion parameter setting of the listed element with the closest attribute vector to the current operating condition is retrieved. The residual distortion correction for the new setting is then tested. If the distortion correction is still not adequate, the adaptive controller generates new predistortion parameter settings. After the system has converged, with assistance of the adaptive controller, the new predistortion parameter setting is added to the predistortion parameter list.

It is important to limit the number of elements within the predistortion parameter list to limit processor computation time. The simplest method is to establish an upper limit on the number of elements and overwrite the oldest element if a new predistortion parameter setting is received. An alternative method is to use pruning. While the processor 202 is not busy processing priority commands, pruning may be preformed. Pruning eliminates redundancies by deleting an older element when its predistortion parameter setting is nearly identical to its neighbor (that is, the neighbor of element 'k' has the lowest $d_{attr}(n,k)$ and is considered redundant if $d_{DPD}(n,k)$ is small). As a result, the number of elements required to represent a region of the attribute space is proportional to the variation in the predistortion parameter settings. This list-based approach produces the most compact representation of the attribute-predistortion parameter mapping.

Figure 3:
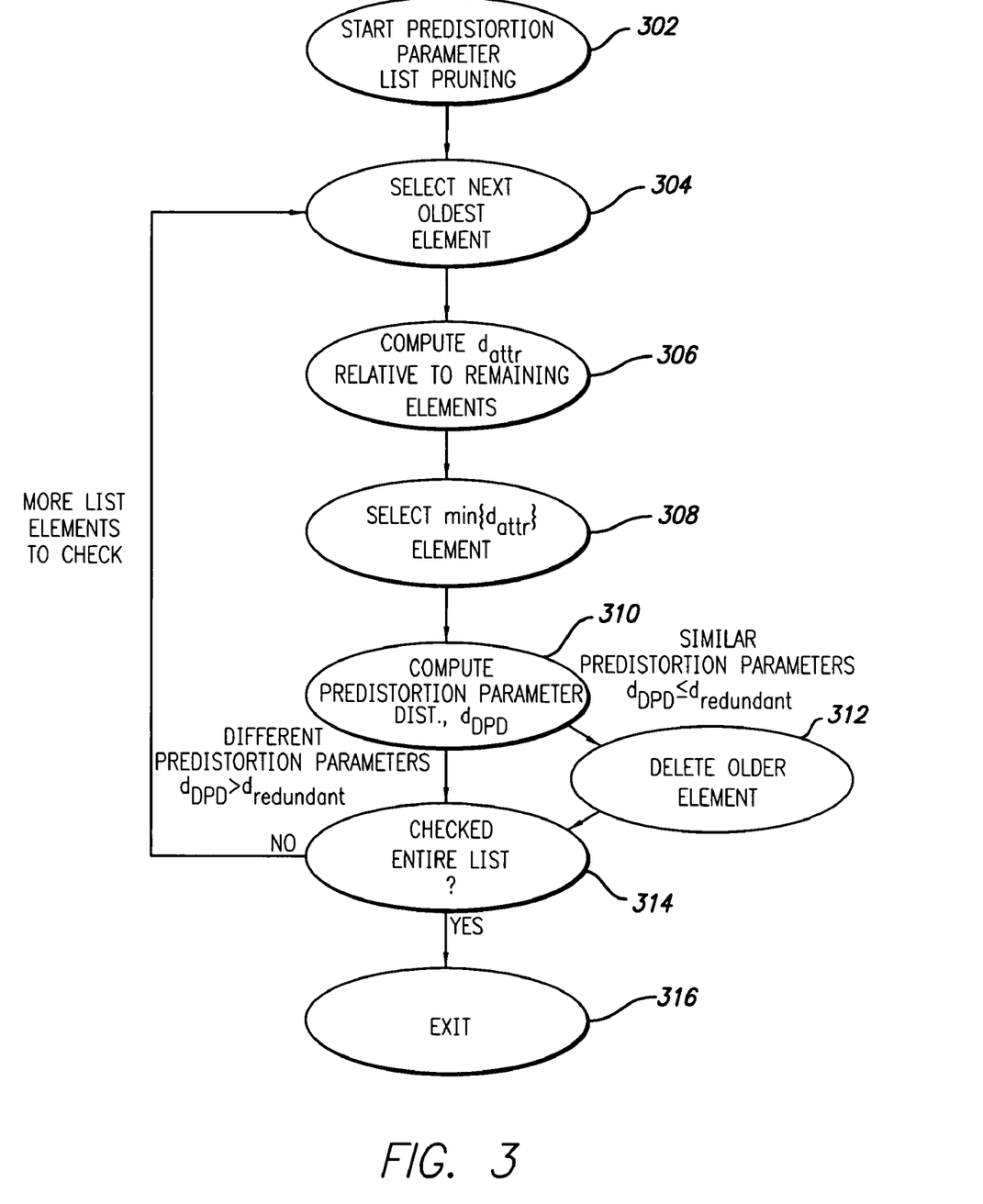
FIG. 3 is a flow diagram of a processing control algorithm showing pruning of a predistortion parameter list to remove redundant elements, in accordance with the present invention.

One implementation of a predistortion parameter list pruning process flow is shown in FIG. 3, as an example only. As shown the process flow begins at 302 when the processor 202 is not occupied with higher priority tasks. The process flow proceeds to 304 to select the oldest element from the predistortion parameter list. Next, the processing determines the nearest element from the remainder of the list using the attribute vector distance measure $d_{attr}$ as defined above by first computing the distance to the remaining elements of the list at 306 and then selecting the element with the minimum distance 308. Next, at 310 the processing flow computes the predistortion parameter distance $d_{DPD}$ as defined above to the selected closest element. If the predistortion parameter settings are the same or sufficiently close, the older element is deleted at 312. Sufficiently close depends on the distortion tolerance and the sensitivity of the distortion to the respective predistortion parameter settings. For example, a minimum distance $d_{redundant}$ may be employed and if $d_{DPD}$ is less than or equal to $d_{redundant}$, the older element is deleted while if $d_{DPD}$ is greater than $d_{redundant}$ both elements are retained. At 314 the process flow checks if the entire list has been checked and if not repeats until the remaining elements are spaced sufficiently apart with respect to the predistortion parameter tolerance (or until a lower limit on the list size is reached).

Figure 4:
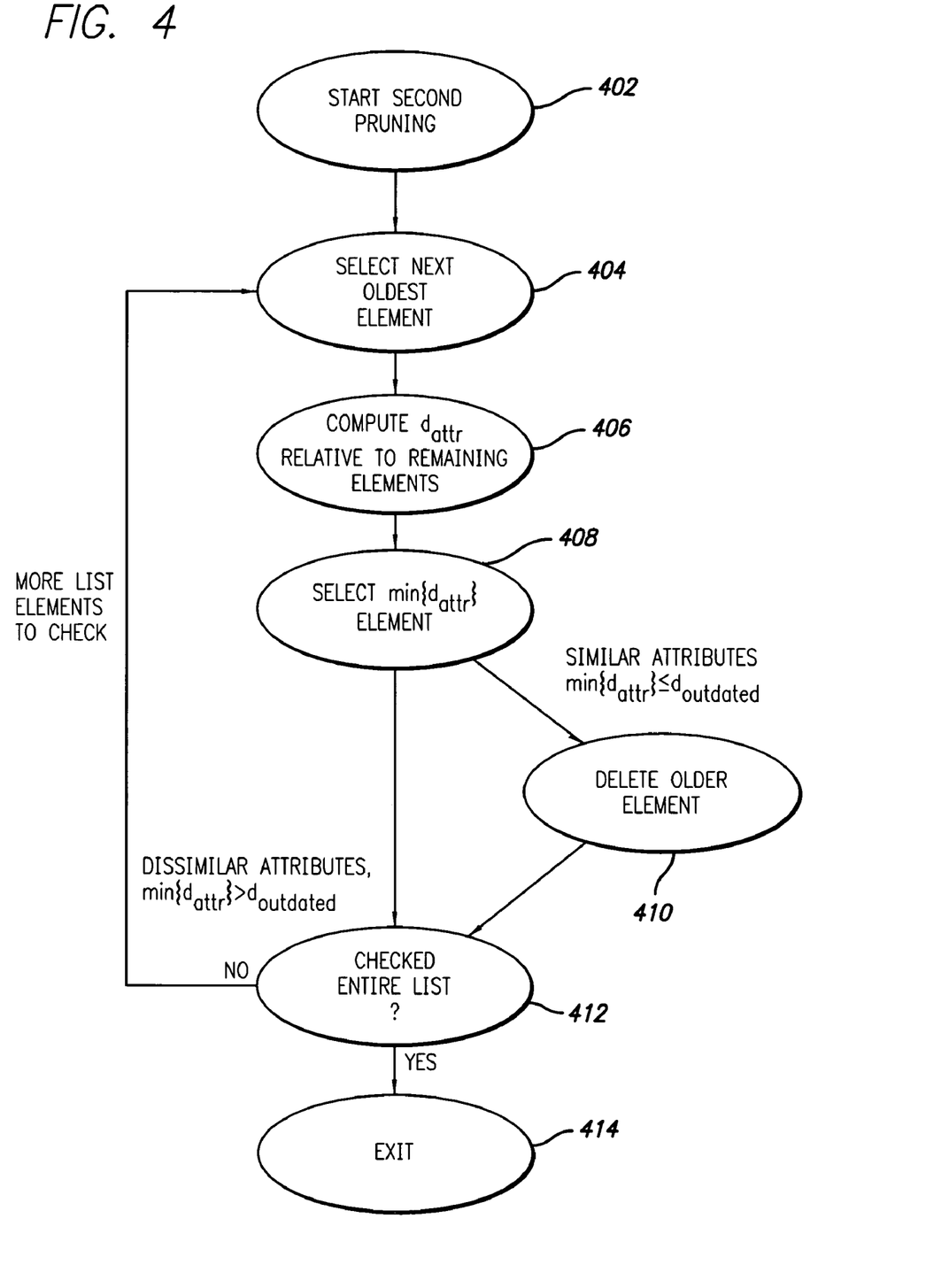
FIG. 4 is a flow diagram of a processing control algorithm showing second pruning of a predistortion parameter list to remove outdated elements, in accordance with the present invention.

A second pruning process is shown in FIG. 4. This may be used to delete out-dated elements from the predistortion parameter list. For example, component aging may change the relationship between the best predistortion parameter setting and a given attribute vector. Small inter-element attribute distances identify potentially out-dated elements. For example, if an element has an incorrect predistortion parameter setting, the residual distortion will be too large, necessitating the use of the adaptive controller function. The adaptive controller will find the new predistortion parameter setting. As a result, two different predistortion parameter settings will be listed for a given attribute vector (or two very similar vectors). Deleting the older element resolves any conflict, as well as keeping the list current.

Referring to the specific process flow for this second pruning, shown in FIG. 4, the second pruning processing begins at 402 when the processor is not executing higher priority tasks (including the first pruning processing). At 404 the process flow selects the oldest element in the predistortion parameter list which has not already been processed for the second pruning. At 406 the distance $d_{attr}$ is computed for this oldest element to each of the remaining elements in the list. Next at 408 the processing determines the element with the minimum distance $d_{attr}$ to the oldest element. If this minimum distance is less than or equal to a predetermined distance $d_{outdated}$, then at 410 the processing deletes the older of the two elements from the predistortion parameter list. If the minimum distance is greater than $d_{outdated}$, however, then these two elements are deemed sufficiently different and both are retained in the predistortion parameter list. At 412 the process flow checks if more elements remain to be checked, and if so the process flow returns to 404 to check the next oldest element in the list. When all elements have been checked the second pruning process exits at 414.

Default predistortion parameter settings may be maintained for the case when the predistortion parameter list is empty. Also, a factory default predistortion parameter setting may be maintained separately so that it will not get pruned.

Figure 5:
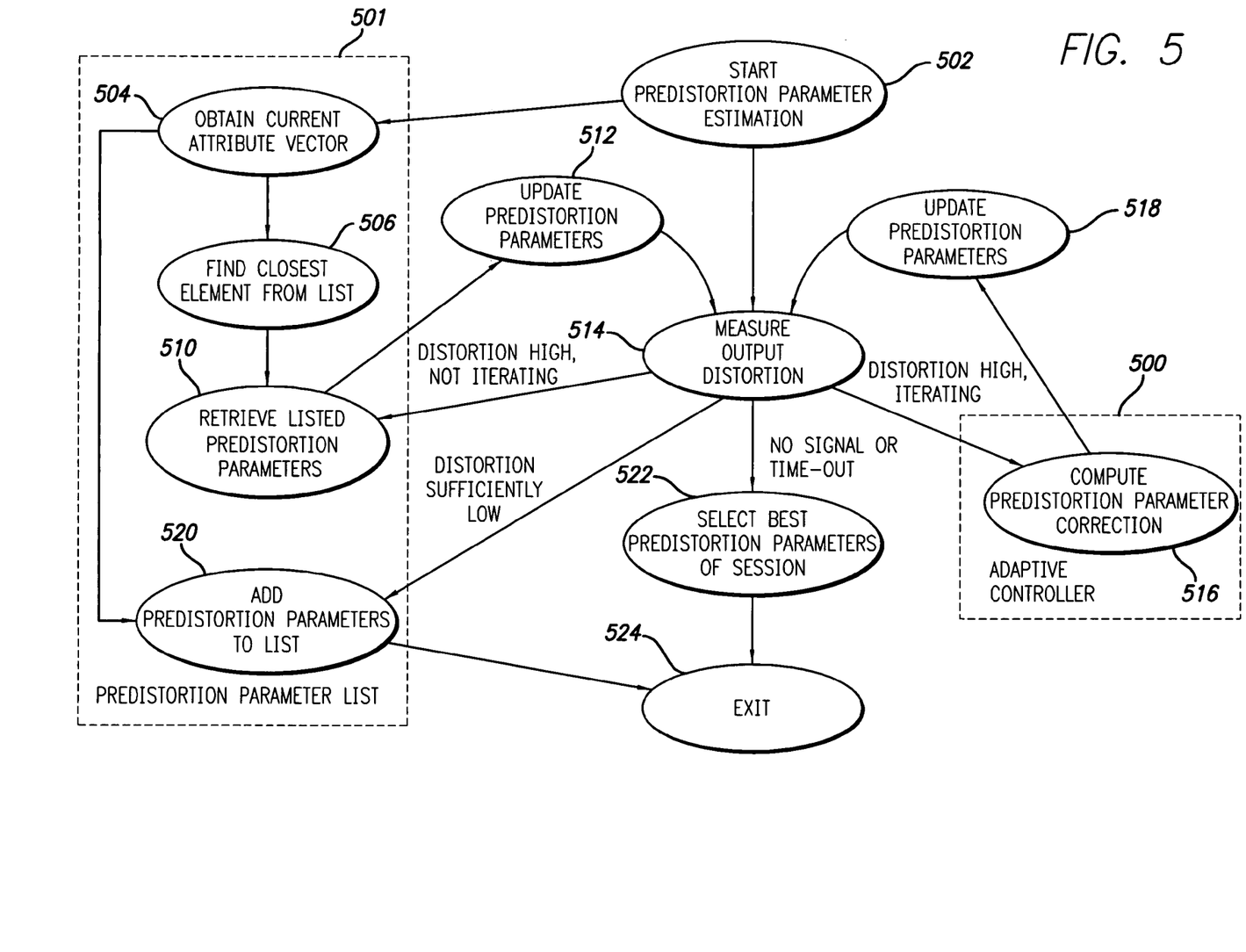
FIG. 5 is a flow diagram of a processing control algorithm showing predistortion parameter estimation and control processing, including interaction between the predistortion parameter list processing and adaptive controller processing, in accordance with the present invention.

Next, referring to FIG. 5, the predistortion parameter estimation and control processing is described. The control process is depicted in FIG. 5.

As generally shown in FIG. 5, the predistortion parameter estimation algorithm uses two parallel processes 500 and 501 as well as a process flow which controls the interplay between these two processes. The first process indicated at 501 generates a new predistortion parameter setting for initial use in the controller processing 500. This process 501 is employed at start up and is run continuously thereafter to allow use for controller processing when output distortion becomes too large. More specifically, the first process flow 501 continually monitors the current operating condition parameters to obtain the current attribute vector as indicated at 504. For example, the processor may determine current temperature, DC power, carrier frequency, and input power to determine the current attribute vector for the current operating conditions. Then at 506 the process flow checks the predistortion parameter list for the list element with the smallest attribute distance from the current vector. This list element predistortion parameter setting is then retrieved at 510. Whether or not this retrieved predistortion parameter setting is used to update the predistortion parameters for the adaptive controller processing 500 may be controlled by distortion measurement processing 514 and the change in the retrieved element. At start up and whenever the measured distortion is too great the predistortion parameter list setting is retrieved and used to update the predistortion parameters at 512. The adaptive controller processing 500 is then initiated and the adaptive controller then computes the predistortion parameters correction at 516 using an iterative controller algorithm, such as described previously.

For example, this process flow may be controlled by a status flag. If the element retrieved at 510 changes, a status flag is cleared indicating that the system is 'not iterating'. The process flow also continually measures the level of output distortion at 514. If the distortion is too large, the status flag is checked. If the flag is clear, a significant change in the attribute vector is indicated, and the predistortion parameters are updated using the new setting retrieved from the predistortion parameter list. After retrieving the new setting, the status flag is set to start the iterative adaptive controller process. If the flag is set already, the adaptive controller process 500 is requested which computes the predistortion parameter corrections at 516 in terms of differential adjustments. The predistortion parameters are updated at 518, and the iterative process is repeated until the distortion is reduced sufficiently. If the measured distortion after completing the adaptive controller processing is small, the predistortion parameter setting and the current attribute vector are stored in the predistortion parameter list at 520. The predistortion parameter estimation routine is then complete. At this point, the predistortion parameter list can be pruned as described previously. At system shut down or after a timeout, the best predistortion parameter setting of the session may be selected at 522, which may be stored and used to initiate a rapid start up.

Figure 6:
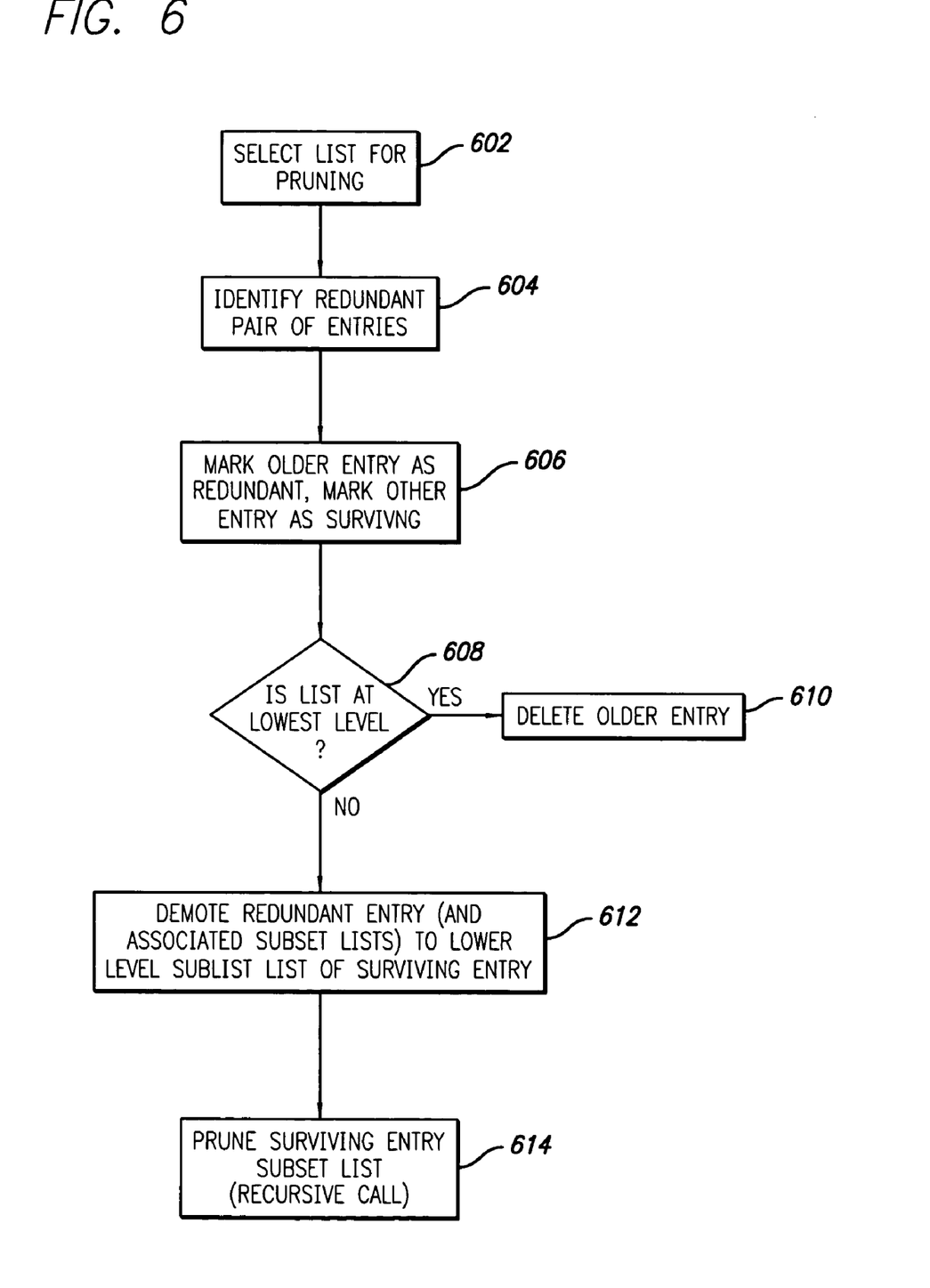
FIG. 6 is a flow diagram of a processing control algorithm showing generation of a hierarchical predistortion parameter list structure, in accordance with the present invention.
Figure 7:
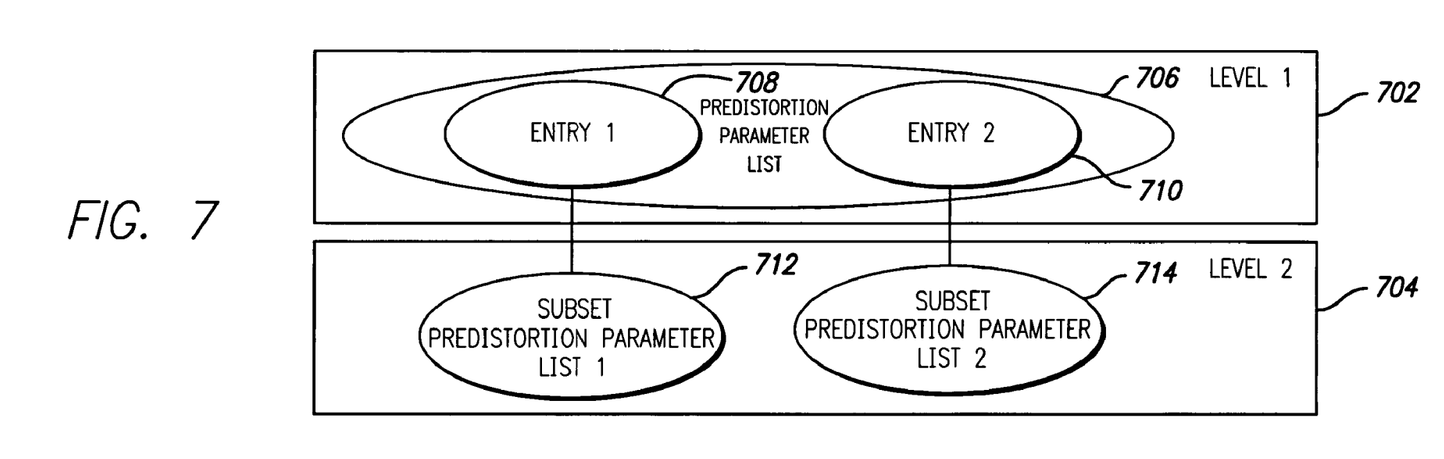
FIG. 7 is a schematic illustration of the hierarchical predistortion parameter list structure before demoting an entry.
Figure 8:
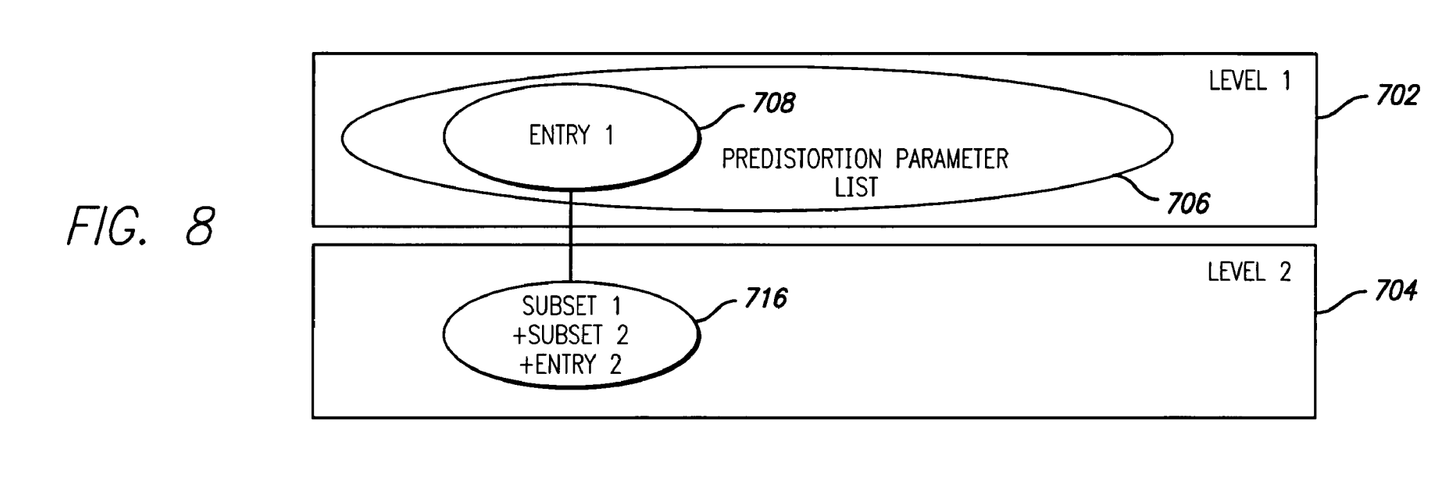
FIG. 8 is a schematic illustration of the hierarchical predistortion parameter list structure after demoting an entry.

Referring to FIGS. 6-8 an additional optional feature of the predistortion parameter list processing is illustrated using a hierarchy of elements. In the above-mentioned approach there is a trade-off when selecting the number of elements within a list. The benefit of allowing a large number of elements is dense coverage of the attribute space. However, the benefit of a small number of elements is that less time is required to determine the element with the minimum attribute distance from the current vector. Using a hierarchical predistortion parameter list structure allows both dense coverage and rapid search.

The use of pruning may be used to generate the hierarchical predistortion parameter lists as shown in FIGS. 6-8. During the redundancy pruning described previously, when two elements are determined to be 'similar', the older element becomes redundant and is deleted and only the other element survives. In a hierarchical approach to list management, the redundant element is not deleted; instead it is 'demoted' to a lower level subset below the surviving element. The creation of lower subsets is recursive, which allows as many levels as necessary to be defined. (In most cases, zero or one subset level would be adequate).

The basic pruning process flow employed to generate hierarchical predistortion parameter lists is shown in FIG. 6. At 602 the pruning commences when the processor is not occupied by higher priority tasks. At 604 a redundant pair of entries are identified. This process 604 may follow the same distance computation described in relation to FIG. 3 (at 304, 306, 308 and 310). At 606 the older entry is marked as the redundant entry and the other is maintained at its current level in the hierarchical list structure. At 608 the pruning process flow checks if the list is at the lowest level. If it is then at 610 the redundant entry is deleted. If the list is not at the lowest level then the redundant entry is demoted at 612 to the next lower level. Its location in the lower level is marked as a sublist entry of the surviving entry in the higher level. Next the pruning process flow proceeds to the next lower level at 614 and processing 602 begins at that level for the current entry sublist Redundant elements can have subsets. This type of hierarchical structure is shown in FIG. 7 and FIG. 8. Before the redundant element 710 is demoted, its lower level subset list 714 is merged with the surviving element's subset list 712 (at the same level). The redundant element 710 is then demoted to a lower level 704. Merging subsets at equal levels causes the subsets to become too large in the short term; however, as the pruning process is initiated, the subsets sizes will return to the desired value.

In the hierarchical list, the highest level 702 preferably has the coarsest sampling (largest value for the threshold $d_{DPD}$). Lower levels have increasingly finer resolutions (smaller $d_{DPD}$). By adjusting the threshold $d_{DPD}$ for each level, it is possible to adjust the number of entries in a given predistortion parameter list at a given level. By increasing $d_{DPD}$, the number of entries in the list decreases. It is desirable to have all of the lists at the various levels of the hierarchical structure having a nearly equal number of entries.

The process flow for hierarchical lists may generally follow the process flow 501 of FIG. 5 as described above. However, the search for the element with the minimum attribute distance at 506 is restricted to one set; this set is referred to as 'active'. When a search 506 begins, the top-level set is active. The search for the predistortion parameter setting nearest to the current attribute vector first finds the nearest entry in the highest level list, then searches that entry's subset list. Once the element with the minimum attribute distance within the top-level is identified, its predistortion parameters are retrieved (as described above in relation to FIG. 5). However, instead of requesting the adaptive controller as above, the element's next lower level subset becomes active. The next lower level subset is then searched for the element with the minimum attribute distance, and a new predistortion parameter setting is retrieved. The process repeats recursively until the next lower subset is empty. At this point the adaptive controller is requested and the adaptive controller uses the retrieved predistortion parameter setting. This process is repeated recursively until the bottom level is reached. If any of the intermediate settings provides sufficient distortion compensation, the process is halted before requesting the adaptive controller. Note that the subset search should include the parent entry (or parent entries if two or more levels below the top) because it may be the best match.

The complexity of the search time is proportional to the product of the number of entries per list (N) and the number of levels in the hierarchy (L). In contrast, the exhaustive search is proportional to N to the power of L, which will in general be significantly higher. (This assumes that each list has N entries. Note that level L has N times more subset lists than level L-1, which means that level L has N to the power of L entries in total).

Note that elements deleted as part of the second pruning process described in relation to FIG. 4 above are out-dated, and hence, should not be saved in a lower level set.

To summarize the foregoing, the disclosed system combines multi-dimensional predistortion parameter list processing and adaptive controller processing to adjust the transmit gain of a digital predistortion amplifier system. The two processes are coupled in a novel manner to improve the dynamic response of the system. The multi-dimensional predistortion parameter list used in the disclosed approach has a different structure compared to an array-based look-up table, thus avoiding the above-mentioned problems of look-up tables. Instead of storing the elements using an array structure, the elements are collected as a set. Each element has the following: (a) a set of parameters or attributes corresponding to the operating conditions affecting the amplifier; and (b) the best set of predistortion parameters found under those operating conditions. A metric is formed which defines the 'distance' between two elements, which is based on the differences between the elements' attributes. If the digital predistortion system detects excessive distortion, the attributes associated with the current operating conditions are measured. Next, the element in the predistortion parameter list with the minimum distance from the current attributes is identified and its corresponding predistortion parameter setting is retrieved from storage. If the new predistortion parameter setting is not adequate, the adaptive controller is activated to further reduce the distortion. Once the predistortion parameter setting is deemed sufficiently close to optimal value, the predistortion parameter setting along with the current attributes are combined to form to a new element within the set. Thus, the predistortion parameter lists are self-generating.

To limit the computational complexity of the search for the minimum distance element, it is desirable to limit the size of the element set. To identify redundant elements, the similarity of elements is measured in terms of attribute distance and predistortion parameter separation (performed during idle times). If the set size exceeds a preset number, the oldest of a pair of similar elements is deleted. By limiting the list size, the time to determine the element with the minimum distance to the current attributes is controllable. If additional elements are desired for greater coverage, it is possible to form a hierarchy of list levels. Instead of deleting the oldest similar element, it is 'demoted' to a lower level subset below the surviving element. If a demoted element contains its own lower level subsets, they are merged with the surviving element's subsets. The creation of lower subsets is recursive, which allows as many levels as necessary to be defined. (In most cases, zero or one subset level would be adequate).

The hierarchical structure allows the search for the minimum distance element to be computationally efficient because each active set is limited in size. Initially, the highest-level set is active. If the element with the minimum distance from the highest-level set does not reduce the distortion sufficiently, then its subset (if it exists) becomes active. The minimum distance match from the lower level subset is tested for distortion correction quality. The subsets are recursively searched until the residual distortion is sufficiently low or the next lower subset is empty. For the latter case, the adaptive controller would be activated to improve the distortion correction.

The combined operation of an adaptive predistortion controller and the disclosed predistortion parameter list gives the disclosed transmitter system the ability to learn from its experiences and to improve its performance in the presence of dynamic conditions such as varying input power levels, changing (or hopping) carrier frequencies, changing temperature or DC supply, or component aging. The system can accommodate any number of attributes (multi-dimensional index space) without a significant increase in complexity. The hierarchical set management allows an arbitrarily large number of elements to be stored without significantly increasing the worst-case delay in finding the element with the minimum attribute distance.

An additional benefit of the disclosed predistortion parameter list is that the attribute space can be sampled unevenly. In general, the sensitivities of the predistortion parameter settings vary over the attribute space. The disclosed system will naturally produce a higher density of elements in the regions with higher sensitivity, as desired.

The predistortion parameter lists provided by the present invention are useful for dynamic waveforms. For example, one application for a power amplifier system is for a hopping beacon. In such applications the predistortion parameter settings for each carrier may be stored to allow for fast hopping (relative to the typical PA settling time).

In view of the above it will be appreciated that the present invention provides a number of advantageous features. The combined use of predistortion parameter lists and adaptive controller processing provides rapid convergence of a digital predistortion transmitter system employing a power amplifier. The self-generating nature of the predistortion parameter list allows the system to learn from past experiences, reducing the search time required by the adaptive controller. The transient surges in distortion energy are reduced and the adaptive controller becomes more robust when provided with good initial estimates of the predistortion parameter settings. The hierarchical structure of the predistortion parameter list allows the search for the minimum distance element to be computational efficient while providing wide coverage of the attribute space.

The present invention has been described in relation to a presently preferred embodiment, however, it will be appreciated by those skilled in the art that a variety of modifications, too numerous to describe, may be made while remaining within the scope of the present invention. Accordingly, the above detailed description should be viewed as illustrative only and not limiting in nature.

What is claimed is:

1. A digital RF transmitter system, comprising:
an input for receiving a digital input signal;
a transmission path comprising a digital predistorter employing adjustable predistortion parameters to predistort the digital input signal, a digital-to-analog converter, an RF up converter, an RF power amplifier, and an output sampling coupler receiving the amplified RF output signal;
an observation path, which measures the sampled output of the coupler, comprising an RF down converter, and an analog-to-digital converter providing the sampled RF output signal in a digital format; and
an adaptive controller coupled to receive the digital input signal and the sampled digital output signal to determine the residual distortion within the output signal and coupled to receive one or more parameters characterizing the operating condition of the amplifier and wherein the adaptive controller is coupled to the digital predistorter and provides adjusted predistortion parameters to the digital predistorter to reduce the distortion further and comprises a predistortion parameter list having a plurality of unordered list elements, wherein the number of list elements changes dynamically, each element having one or more predistortion parameters and one or more parameters characterizing the operating condition of the amplifier system.

2. A digital RF transmitter system as set out in claim 1, wherein the adjustable predistortion parameters are part of an inverse gain model which alters the gain of the transmitter path as a function of nonlinear modes of the input magnitude.

3. A digital RF transmitter system as set out in claim 1, wherein the adjustable predistortion parameters comprise weights for both memoryless and memory-based basis waveforms.

4. A digital RF transmitter system as set out in claim 1, wherein the parameters characterizing the operating condition of the amplifier may comprise one or more of temperature, DC power supply, input signal power and input signal carrier frequency.

5. A digital RF transmitter system as set out in claim 1, wherein the parameters characterizing an operating condition of the amplifier comprise an attribute vector and a distance is defined between any two attribute vectors.

6. A digital RF transmitter system as set out in claim 5, wherein the adaptive controller derives a current attribute vector from input parameters and computes the distance to the attribute vectors of the list elements and selects the list element with the least distance for use as predistortion parameters in the digital predistorter.

7. A digital RF transmitter system as set out in claim 5, wherein the adaptive controller continually measures the attribute vector and a set of predistortion parameters are retrieved from the predistortion parameter list when the change of the measured attribute vector is in excess of a predetermined value.

8. A digital RF transmitter system as set out in claim 5, wherein the distance between closest attribute vectors may vary throughout the predistortion parameter list.

9. A digital RF transmitter system as set out in claim 1, wherein the adaptive controller continually measures distortion using the digital output and digital input and a set of predistortion parameters are retrieved from the predistortion parameter list when the measured distortion exceeds a predetermined value.

10. A digital RF transmitter system as set out in claim 1, wherein the adaptive controller employs a selected element as an initial set of predistortion parameters and computes new predistortion parameters from the initial set of parameters employing an iterative control algorithm.

11. A digital RF transmitter system as set out in claim 10, wherein the adaptive controller updates the predistortion parameter list with new predistortion parameters after completing the iterative computation.

12. An adaptive controller for controlling the distortion compensation of an amplifier system, comprising:
one or more inputs for receiving one or more attribute parameters corresponding to current operating conditions of the amplifier system;
one or more processors coupled to the one or more inputs, the one or more processors having an associated list of predistortion parameter settings, wherein the list comprises an unordered collection of elements where the number of elements changes dynamically, and programmed with a predistortion parameter list algorithm and a controller algorithm to provide adjustments to the predistortion parameter settings to control the distortion correction of the amplifier system, wherein the predistortion parameter list algorithm generates the predistortion parameter list with predistortion parameter settings computed by the controller algorithm and associates one or more attribute parameters with each predistortion parameter setting.

13. An adaptive controller for controlling the distortion compensation of an amplifier system as set out in claim 12, wherein the predistortion parameter list algorithm selects a predistortion parameter setting from the predistortion parameter list for use by the controller algorithm at start up or when the output distortion becomes sufficiently large.

14. An adaptive controller for controlling the distortion compensation of an amplifier system as set out in claim 12, wherein the predistortion parameter list algorithm selects a stored predistortion parameter setting for use by the controller algorithm by computing the distance between the one or more attribute parameters corresponding to current operating conditions and the attribute parameters associated with each of the predistortion parameter settings in the list and selecting the predistortion parameter setting corresponding to the attribute parameter with the minimum distance.

15. An adaptive controller for controlling the distortion compensation of an amplifier system as set out in claim 14, wherein the distance computation is weighted with different weights for different attribute parameters.

16. An adaptive controller for controlling the distortion compensation of an amplifier system as set out in claim 14, wherein the distance $d_{attr}$ between two sets of attribute parameters "n" and "0" is defined by the weighted $L_{inf}$ norm distance measure or the weighted $L_2$ norm distance measure.

17. An adaptive controller for controlling the distortion compensation of an amplifier system as set out in claim 12, wherein the attribute parameters may comprise one or more of temperature, DC supply voltage, input signal power and input signal carrier frequency.

18. An adaptive controller for controlling the distortion compensation of an amplifier system as set out in claim 12, wherein the adaptive controller further comprises one or more inputs for receiving output distortion data.

19. An adaptive controller for controlling the distortion compensation of an amplifier system as set out in claim 18, wherein the output distortion data comprises a baseband digital representation of the output signal provided from an observation path.

20. An adaptive controller for controlling the distortion compensation of an amplifier system as set out in claim 12, wherein the predistortion parameter settings are coefficients in a polynomial expansion including bandlimited nonlinear modes modeling memory effects in the amplifier system.

21. A method for controlling an amplifier system having an adaptive control loop comprising a control loop input a first signal path including a digital predistorter and an RF amplifier, and a second signal path which feeds back the output of the RF amplifier, the method comprising:
   providing a list of unordered list elements, wherein the number of list elements changes dynamically, the list elements comprising predistortion parameter settings, each predistortion parameter selling having an associated operating condition;
   detecting the current operating conditions of the amplifier system;
   comparing the current operating conditions to those in the list of predistortion parameter settings; and
   selecting the predistortion parameter setting associated with the most similar operating condition in the list.

22. A method for controlling an amplifier system as set out in claim 21, wherein the relevant operating conditions are configured as a multi-dimensional attribute vector.

23. A method for controlling an amplifier system as set out in claim 21, wherein comparing the current operating conditions to those in the list of predistortion parameter settings comprises measuring a distance between the current attribute vector and each of the attribute vectors of the list.

24. A method for controlling an amplifier system as set out in claim 23, wherein the spacing of the stored predistortion parameter settings, as defined by the attribute vector distance, varies throughout the list.

25. A method for controlling an amplifier system as set out in claim 23, wherein a higher density of predistortion parameter settings are provided in regions of the list where the distortion correction is most sensitive to one or more operating conditions comprising the attribute vector.

26. A method for controlling an amplifier system as set out in claim 21, wherein selecting the predistortion parameter selling associated with the most similar operating condition in the list comprises determining the attribute vector having the minimum distance from the current operating condition attribute vector.

27. A method for controlling an amplifier system as set out in claim 21, further comprising computing a new predistortion parameter setting employing an iterative adaptive controller algorithm, wherein the predistortion parameter setting associated with the most similar operating condition is used as the initial predistortion parameter setting for the adaptive controller algorithm.

28. A method for controlling an amplifier system as set out in claim 27, further comprising updating the predistortion parameter list with a new predistortion parameter setting computed by the adaptive controller algorithm.

29. A method for controlling an amplifier system as set out in claim 21, wherein the size of the predistortion parameter list is dynamic.

30. A method of maintaining a list of predistortion parameter settings of an adaptive digital predistortion amplifier system, said list comprising a plurality of elements each element having a predistortion parameter setting and a set of operating condition parameters corresponding to operating conditions of the amplifier system, said method comprising:
   selecting an element of the predistortion parameter list;
   determining the element of the predistortion parameter list having the most similar corresponding operating conditions to the selected element;
   determining if the two elements are sufficiently similar to be considered redundant; and
   deleting the oldest of the two elements of the predistortion parameter list if the elements are redundant.

31. A method of maintaining a list of predistortion parameter settings of an adaptive digital predistortion amplifier system as set out in claim 30, wherein selecting an element of the predistortion parameter list comprises selecting the oldest element of the list not previously subject to list maintenance processing.

32. A method of maintaining a list of predistortion parameter settings of an adaptive digital predistortion amplifier system as set out in claim 30, wherein determining the element of the predistortion parameter list having the most similar corresponding operating conditions to the selected element comprises determining a distance measure to the operating condition parameter values of each of the remaining elements of the predistortion parameter list and selecting the element having the minimum distance.

33. A method of maintaining a list of predistortion parameter settings of an adaptive digital predistortion amplifier system as set out in claim 32, wherein the distance measure comprises a weighted difference between operating condition parameter values.

34. A method of maintaining a list of predistortion parameter settings of an adaptive digital predistortion amplifier system as set out in claim 30, wherein the operating condition parameters of the amplifier system comprise one or more of temperature, DC power supply, input signal power and input signal carrier frequency.

35. A method of maintaining a list of predistortion parameter settings of an adaptive digital predistortion amplifier system as set out in claim 30, wherein determining if the elements are sufficiently similar to be considered redundant comprises determining a distance measure between the predistortion parameter settings and comparing the predistortion parameter distance to a redundant distance threshold.

36. A method of maintaining a list of predistortion parameter settings of an adaptive digital predistortion amplifier system as set out in claim 30, wherein determining if the elements are sufficiently similar to be considered redundant comprises comparing the distance between the operating condition parameters of the two elements to an outdated distance threshold.

37. A method of maintaining a list of predistortion parameter settings of an adaptive digital predistortion amplifier system as set out in claim 30, further comprising repeating said list maintenance processing for each element of the predistortion parameter list.

38. A method of generating a hierarchical list of predistortion parameter settings of an adaptive digital predistortion amplifier system, said list comprising a plurality of elements each element having a predistortion parameter setting and a corresponding set of parameters corresponding to operating conditions of the amplifier system, and having a hierarchical structure comprising at least two levels, the method comprising:
   selecting an element in a first level of the predistortion parameter list;

determining the element of the first level of the predistortion parameter list having the most similar corresponding operating conditions to the selected element; and demoting the oldest of the two elements to a lower level of the hierarchical predistortion parameter list.

39. A method of generating a hierarchical list of predistortion parameter settings of an adaptive digital predistortion amplifier system as set out in claim 38, wherein determining the element of the predistortion parameter list having the most similar corresponding operating conditions to the selected element comprises determining a distance measure to the operating conditions of each of the remaining elements of the first level of the predistortion parameter list and selecting the element having the minimum distance.

40. A method of generating a hierarchical list of predistortion parameter settings of an adaptive digital predistortion amplifier system as set out in claim 38, further comprising determining if the two elements are redundant, wherein the older element is only demoted if the elements are redundant.

41. A method of generating a hierarchical list of predistortion parameter settings of an adaptive digital predistortion amplifier system as set out in claim 38, further comprising repeating the list processing for each level of the hierarchical list.

42. A method of generating a hierarchical list of predistortion parameter settings of an adaptive digital predistortion amplifier system as set out in claim 38, further comprising deleting the older entry if the list maintenance processing is at the lowest level of the hierarchy.

43. A method of generating a hierarchical list of predistortion parameter settings of an adaptive digital predistortion amplifier system as set out in claim 38, wherein the demoted element is associated as a subset list entry of the redundant element not demoted.

44. A method of generating a hierarchical list of predistortion parameter settings of an adaptive digital predistortion amplifier system as set out in claim 43, wherein an element being demoted and having a subset list is merged with the subset list of a redundant element not demoted.

45. A method for controlling an amplifier system having an adaptive control loop comprising a control loop input, a first signal path, a second signal path, and a control loop output, at least one of the first and second signal paths including an amplifier and a predistorter, the method comprising:

providing a hierarchical list of predistortion parameter settings having at least two levels, each predistortion parameter setting having an associated operating condition and some or all of the predistortion parameter settings in a highest level having subset predistortion parameter settings in a lower level;

detecting the current operating conditions of the amplifier system and comparing the current operating conditions to those in the highest level of the hierarchical list of predistortion parameter settings;

selecting the predistortion parameter setting associated with the most similar operating condition in the highest level of the list;

comparing the current operating conditions to those in the subset of the selected highest level predistortion parameter setting;

selecting the predistortion parameter setting of the subset with the most similar operating condition; and selecting the predistortion parameter setting in the higher or lower level having the most similar operating condition to the current operating condition.

46. A method for controlling an amplifier system as set out in claim 45, further comprising repeating the processing for each level of the hierarchical list until the next lower subset is empty.

47. A method for controlling an amplifier system as set out in claim 45, wherein the highest level has a coarser spacing of predistortion parameter settings than the lower level.

48. A method for controlling an amplifier system as set out in claim 45, wherein any two predistortion parameter settings have a predistortion parameter distance and the highest level has a larger predistortion parameter distance between settings than the lower level.

49. A method for controlling an amplifier system as set out in claim 48, wherein the predistortion parameter distance comprises a weighted difference between the predistortion parameter settings.

50. A method for controlling an amplifier system as set out in claim 45, wherein the predistortion parameter settings comprise an inverse gain model settings and the weighting comprises predistortion parameter sensitivity.

* * * * *